US009412758B2

(12) United States Patent
Zwingman et al.

(10) Patent No.: US 9,412,758 B2
(45) Date of Patent: Aug. 9, 2016

(54) SEMICONDUCTOR ON INSULATOR (SOI) STRUCTURE WITH MORE PREDICTABLE JUNCTION CAPACITANCE AND METHOD FOR FABRICATION

(75) Inventors: Robert L. Zwingman, Walnut, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 12/286,471

(22) Filed: Sep. 29, 2008

(65) Prior Publication Data

US 2009/0146210 A1 Jun. 11, 2009

Related U.S. Application Data (60) Provisional application No. 61/007,035, filed on Dec. 10, 2007.

(51) Int. Cl.
*H01L 21/70* (2006.01)
*H01L 27/12* (2006.01)
*H01L 21/762* (2006.01)
*H01L 21/84* (2006.01)

(52) U.S. Cl.
CPC ...... *H01L 27/1203* (2013.01); *H01L 21/76264* (2013.01); *H01L 21/84* (2013.01)

(58) Field of Classification Search
CPC . H01L 21/76; H01L 21/765; H01L 21/76264; H01L 21/76283
USPC .......... 257/508, 520, 350, 510, 513, E27.112, 257/506, 545, 12, 347, 348, 349, 373, 374, 257/382, 396; 438/282, 298, 910, 149, 479, 438/517, 196, 207, 218, 221, 248, 294, 296, 438/359, 391
See application file for complete search history.

(56) References Cited

U.S. PATENT DOCUMENTS

| 5,920,108 | A | * | 7/1999 | Hemmenway et al. ....... 257/508 |
| 6,501,133 | B1 | * | 12/2002 | Fujiwara ....................... 257/347 |
| 6,562,666 | B1 | * | 5/2003 | Park et al. ..................... 438/149 |
| 6,627,954 | B1 | * | 9/2003 | Seefeldt ........................ 257/350 |
| 7,307,273 | B2 | * | 12/2007 | Currie ............................. 257/18 |
| 7,670,896 | B2 | * | 3/2010 | Zhu et al. ...................... 438/233 |
| 2003/0189231 | A1 | * | 10/2003 | Clevenger et al. ............ 257/355 |
| 2005/0156274 | A1 | * | 7/2005 | Yeo .................. H01L 21/76229 257/510 |
| 2006/0022270 | A1 | * | 2/2006 | Boyd et al. .................... 257/351 |
| 2007/0057302 | A1 | * | 3/2007 | Ho et al. ....................... 257/301 |
| 2007/0161169 | A1 | * | 7/2007 | Belyansky et al. ........... 438/197 |
| 2008/0246041 | A1 | * | 10/2008 | Liu et al. ........................ 257/77 |

* cited by examiner

*Primary Examiner* — Thanh Y Tran
(74) *Attorney, Agent, or Firm* — Farjami & Farjami LLP

(57) ABSTRACT

A disclosed embodiment is a semiconductor on insulator (SOI) structure comprising a buried oxide layer over a bulk semiconductor layer, and a device layer over the buried oxide layer. At least one transistor is fabricated in the device layer, wherein a source/drain junction of the transistor does not contact the buried oxide layer, thereby causing the source/drain junction to have a source/drain junction capacitance. The SOI structure also comprises at least one trench extending through the device layer and contacting a top surface of the buried oxide layer, thereby electrically isolating the at least one transistor. In one embodiment the at least one trench is formed after fabrication of the at least one transistor and is filled with only dielectric. In one embodiment, one or more wells may be formed in the device layer. In one embodiment the bulk semiconductor layer has a high resistivity of typically about 1000 ohms-centimeter or greater.

14 Claims, 6 Drawing Sheets

SEMICONDUCTOR ON INSULATOR (SOI) STRUCTURE WITH MORE PREDICTABLE JUNCTION CAPACITANCE AND METHOD FOR FABRICATION

The present application claims the benefit of and priority to a provisional patent application entitled "Semiconductor on Insulator (SOI) Structure, Method for Fabrication, and Circuits Using Same," Ser. No. 61/007,035 filed on Dec. 10, 2007. The disclosure in that provisional application is hereby incorporated fully by reference into the present application.

BACKGROUND OF THE INVENTION

1. Field of the Invention

The present invention is generally in the field of fabrication of semiconductor structures. More particularly, the invention is in the field of fabrication of semiconductor on insulator (SOI) structures.

2. Background Art

Semiconductor devices and structures are typically fabricated on conventional semiconductor wafers. One type of conventional semiconductor wafer is a bulk silicon wafer, which has a substantially uniform composition and is relatively inexpensive. Circuits made by fabricating semiconductor structures such as, for example, transistors, on conventional bulk silicon wafers typically suffer from several drawbacks. For example, it is difficult to electrically isolate such semiconductor structures when fabricated on a bulk silicon wafer, because although the structures can be partially electrically isolated by virtue of, for example, isolating trenches, electric currents can still flow under such trenches. Neighboring semiconductor devices in such structures thus tend to interfere with one another when fabricated on bulk silicon wafers.

Some of the problems experienced when utilizing bulk silicon wafers can be partially avoided by instead using another conventional semiconductor wafer, such as a semiconductor on insulator ("SOI") wafer (for example, a silicon on insulator wafer). Instead of having a substantially uniform composition like a conventional bulk silicon wafer, a SOI wafer has several layers, such as a device layer, a buried oxide layer, and a bulk semiconductor layer. The utilization of a buried oxide layer can help address the electrical isolation problem experienced when utilizing bulk silicon wafers. The buried oxide layer, utilized in concert with semiconductor structures incorporating isolating trenches, can more effectively isolate semiconductor devices fabricated in the device layer. Disadvantageously, semiconductor devices must typically be redesigned for fabrication in the device layer of a conventional SOI wafer. Moreover, bulk silicon wafer design methodologies and design models (some times also referred to as "design kits") must be re-developed for use in conventional SOI wafer design, because a conventional SOI wafer has electrical and other characteristics that significantly differ from those of a bulk silicon wafer.

Thus, there is a need in the art for a semiconductor structure that overcomes the disadvantages associated with utilizing conventional semiconductor structures and conventional SOI structures in semiconductor device fabrication.

SUMMARY OF THE INVENTION

A semiconductor on insulator (SOI) structure and method for fabrication, substantially as shown in and/or described in connection with at least one of the figures, and as set forth more completely in the claims.

DETAILED DESCRIPTION OF THE INVENTION

The present invention is directed to a semiconductor on insulator (SOI) structure and method for fabrication. Although the invention is described with respect to specific embodiments, the principles of the invention, as defined by the claims appended herein, can obviously be applied beyond the specific embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
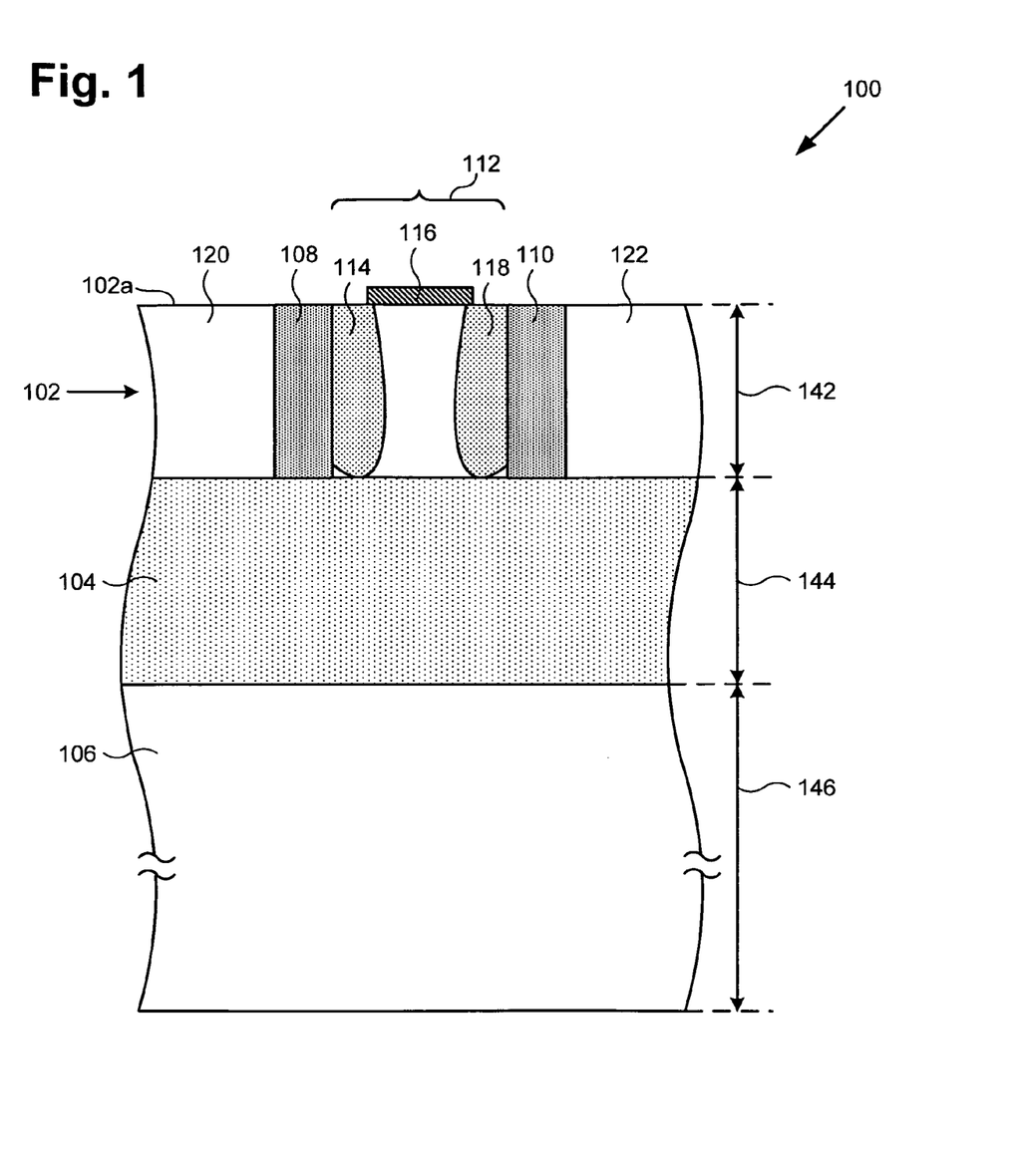
FIG. 1 shows an example of a conventional semiconductor on insulator (SOI) structure.

In FIG. 1, a conventional semiconductor on insulator ("SOI") wafer cross section is shown as structure 100. Structure 100 comprises exemplary device layer 102, buried oxide layer 104, and bulk semiconductor layer 106. Device layer 102 comprises a semiconductor such as, for example, silicon, and has thickness 142, which might be about 800 Angstroms in one embodiment. Buried oxide layer 104, which is situated below device layer 102, is an insulator such as, for example, silicon oxide, and has thickness 144, which might be about 1200 Angstroms in one embodiment. Bulk semiconductor layer 106 is situated below buried oxide layer 104 and, in one embodiment, layer 106 has a resistivity of about 3 to 20 ohms-centimeter, and has thickness 146 which might be about 725 microns in one embodiment. As shown in FIG. 1, bulk semiconductor layer 106 forms the bottom layer of structure 100.

Device layer 102, buried oxide layer 104, and bulk semiconductor layer 106 of conventional structure 100 can be produced by several methods as known in the art. For example, one method involves growing oxide layers on two silicon wafers, placing the oxide layers in contact with each other, annealing the oxide layers together, and grinding the reverse side of one of the silicon wafers to produce a SOI wafer having a device layer of the desired thickness. Another exemplary method utilizing two silicon wafers involves growing an oxide on one silicon wafer (typically 80% of the resulting buried oxide layer), growing an oxide on the other silicon wafer (typically 20% of the resulting buried oxide layer), implanting hydrogen, placing the two silicon wafers together, and thermally shocking the resulting assembly. The shock cracks one of the silicon wafers, producing a new top surface (e.g., top surface 102a of structure 100) resulting in a SOI wafer of the desired thickness.

Structure 100 also comprises trench 108 and trench 110. To form trenches 108 and 110, the material of device layer 102 situated where trenches 108 and 110 will be formed is removed, e.g. etched away, and LOCOS or STI oxidation processes, for example, are used to fill both trenches with an insulative oxide. Trenches 108 and 110 typically extend through device layer 102 and contact the top surface of buried oxide layer 104, as shown in FIG. 1. In the region, or island, of device layer 102 confined by trenches 108 and 110, a semiconductor device such as transistor 112 can be fabricated. Transistor 112 is electrically isolated from neighboring islands 120 and 122 by trenches 108 and 110, respectively, and buried oxide layer 104. This isolation is one conventional advantage of building semiconductor structures such as transistor 112 on a SOI wafer, because the isolation allows such semiconductor structures to experience, for example, positive and negative voltage excursions without affecting neighboring devices and without shorting to ground.

Transistor 112 of structure 100 could be, for example, an NFET or a PFET transistor, and comprises source 114, gate 116, and drain 118. Source 114 and drain 118 typically extend all the way through device layer 102 and contact the top surface of buried oxide layer 104. Because there is thus no, or almost no, semiconductor material, e.g. silicon, between source 114 or drain 118 and the top surface of buried oxide layer 104, there is no, or almost no, semiconductor junction to create a capacitive load. Such low capacitance allows for, for example, higher speed operation or lower power consumption. However, such low or non-existent junction capacitance also prevents the utilization of well understood bulk silicon wafer design methodology, device models, and well developed design kits that take into account existence of certain amount of junction capacitance based on, for example, transistor sizes, device geometries and other factors. In other words, conventional SOI structure 100 must be designed and fabricated using only new, less developed, and less prevalent design methodologies, device models and design kits that are not as well developed, tested or understood, and which also introduce additional development costs and inefficiencies in the design and fabrication of SOI devices using conventional SOI structure 100 in FIG. 1.

Conventional structure 100 thus illustrates several advantages and disadvantages of utilizing a conventional SOI wafer instead of a conventional bulk silicon wafer when fabricating certain semiconductor structures, such as transistor 112 and trenches 108 and 110. Building trenches similar to trenches 108 and 110 in a conventional bulk silicon wafer, instead of a conventional SOI wafer as shown in FIG. 1, would not produce effective isolation because semiconductor devices, such as transistor 112, could short out to other devices or electrically communicate under the trenches. However, as discussed above, utilizing a conventional SOI wafer imposes significant design challenges and costs.

Figure 2:
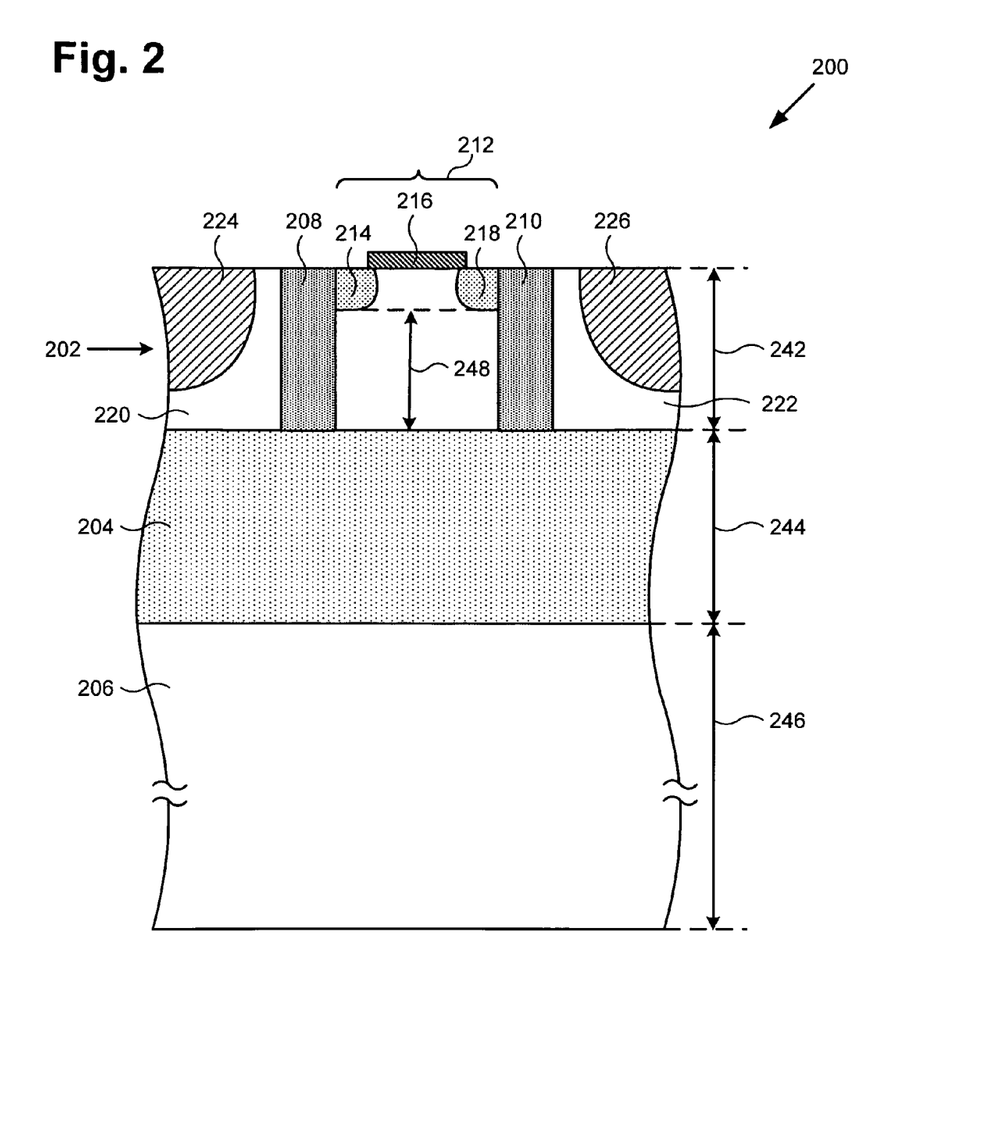
FIG. 2 shows an exemplary SOI structure according to one embodiment of the present invention.

FIG. 2 shows a semiconductor on insulator ("SOI") wafer cross section, according to one embodiment of the present invention, as structure 200. Structure 200 shares certain features with structure 100, and comprises device layer 202, buried oxide layer 204, and bulk semiconductor layer 206. In this embodiment, and by way of examples only, device layer 202 has a thickness 242 of about 1.4 microns. Buried oxide layer 204 is situated below device layer 202, is an insulator such as, for example, silicon oxide, and has a thickness 244 of, for example, about 1 micron. Bulk semiconductor layer 206 is situated below buried oxide layer 204, has a thickness 246 of, for example, about 725 microns, has a high resistivity of, for example, typically about 1000 ohms-centimeter or greater, and forms the bottom of structure 200. Thus, in this embodiment, while the invention's bulk semiconductor layer 206 may have a thickness similar, for example, to conventional bulk semiconductor layer 106, the invention's buried oxide layer 204 and device layer 202 are significantly thicker than respective conventional buried oxide layer 104 and device layer 102. Additionally, the invention's bulk semiconductor layer 206 has a significantly greater resistivity than conventional bulk semiconductor layer 106.

Structure 200 comprises semiconductor devices, such as for example transistor 212, which in one embodiment could be, for example, an NFET or a PFET transistor. Continuing with this example, transistor 212 comprises source 214, gate 216, and drain 218. Because of the increased thickness of device layer 202, source 214 and drain 218 do not extend all the way through device layer 202 to contact the top surface of buried oxide layer 204. Instead, a layer with intervening thickness 248 remains between the bottom surfaces of source 214 and drain 218 and the top surface of buried oxide layer 204. Consequently, a semiconductor junction is formed by source 214 and drain 218 within device layer 202. Each such semiconductor junction will have an associated junction capacitance, e.g. the source/drain junctions of transistor 212 have corresponding source/drain junction capacitances.

The source/drain junction capacitances of transistor 212 behave similarly to the junction capacitances of a transistor implemented in a conventional bulk silicon wafer, instead of a conventional SOI wafer, in part because of the greater thickness of device layer 202 compared to the thickness of conventional device layer 102. The better understood and more predictable junction capacitances in structure 200 result in more predictable behavior of transistor 212 such that, for example, computer simulation programs and bulk silicon wafer design kits that are well understood and widely used for conventional bulk silicon fabrication can be utilized to design and implement transistor 212 in the invention's SOI wafer. Significantly, the behavior of transistor 212 is better understood and more predictable than the behavior of transistor 112 in FIG. 1 which, for example, practically lacks any source or drain junction capacitance because source 114 and drain 118 of transistor 112 extend all the way to the top surface of buried oxide layer 104.

Transistor 212 is electrically isolated from neighboring islands 220 and 222 by adjacent trenches 208 and 210, respectively, and by buried oxide layer 204. In order to achieve this isolation, in one embodiment of the invention trenches 208 and 210 are etched to extend all the way, or almost all the way, through device layer 202 and contact, or almost contact, the top surface of buried oxide layer 204. According to the present invention, a novel process is used to form trenches 208 and 210 after the fabrication of transistor 212, instead of forming the trenches prior to fabrication of transistor 212, as is the case in the fabrication of conventional structure 100. More specifically, to fabricate structure 100, trenches 108 and 110 are etched early in the fabrication process, a thin layer of oxide is grown in each trench, the trenches are coated and lined with more oxide, and then the trenches are filled with polysilicon, as known in the art. In contrast, trenches 208 and 210 are etched during a "backend" process after fabrication of transistor 212 and are filled with a dielectric, which in one embodiment is silicon oxide, and/or some additive, instead of polysilicon.

According to one embodiment of the invention, islands 220 and 222 may have well 224 and well 226, respectively, which cannot be formed in the process used to create SOI structure 100. Wells 224 and 226 may or may not extend all the way through device layer 202, and may or may not contact the top of buried oxide layer 204. The wells, if they exist, can be P-wells or N-wells, depending on the type of semiconductor devices to be placed in island 220 and island 222, if any.

Figure 3:
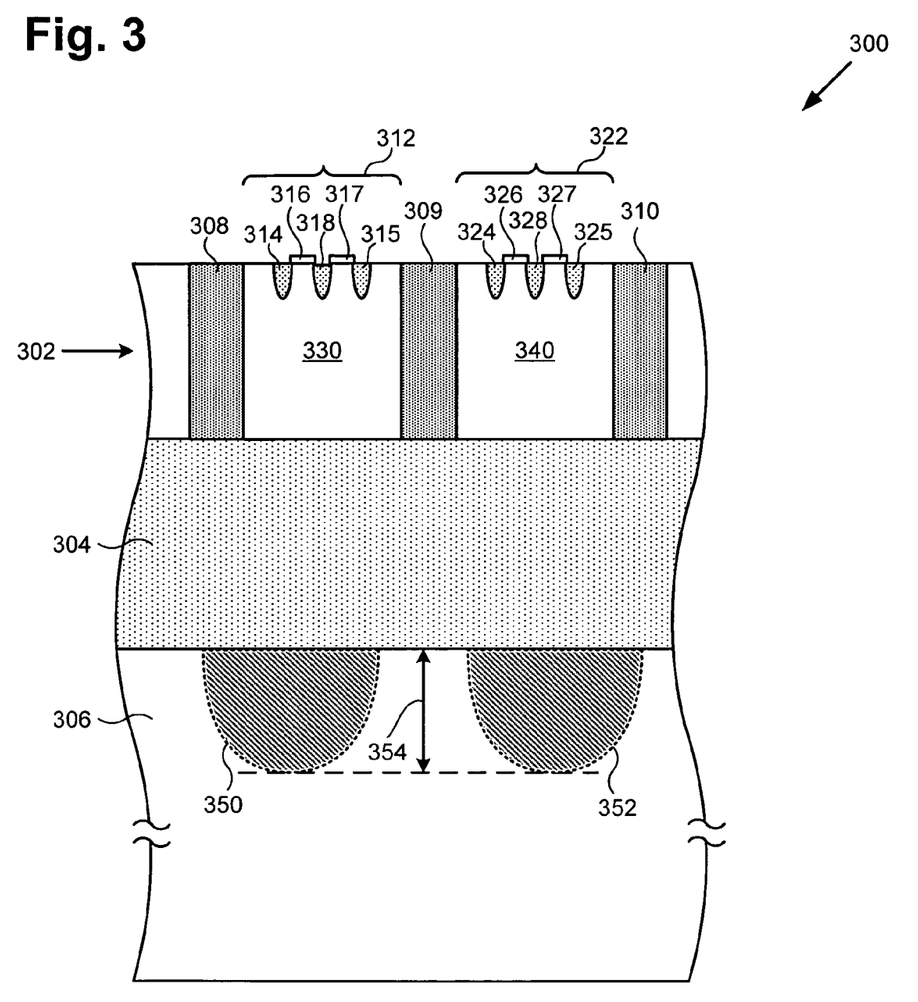
FIG. 3 shows an exemplary SOI structure according to one embodiment of the present invention.

FIG. 3 shows a semiconductor on insulator ("SOI") wafer cross section, according to one embodiment of the present invention, as structure 300. Structure 300 comprises device layer 302, buried oxide layer 304, and bulk semiconductor layer 306, which correspond to device layer 202, buried oxide layer 204, and bulk semiconductor layer 206 of structure 200. Structure 300 also comprises trench 308, trench 309, and trench 310, which correspond to trenches 208 and 210 in structure 200. Additionally, structure 300 comprises transistor 312 and transistor 322, each of which is a semiconductor device corresponding to transistor 212 in structure 200. In one embodiment of the invention, transistors 312 and 322 can exist in neighboring islands 330 and 340 in device layer 302, separated by trench 309 and isolated from other semiconductor devices by trenches 308 and 310 and by buried oxide layer 304.

FIG. 3 illustrates how the combination of the isolation provided by buried oxide layer 304 and by trenches 308, 309, and 310, the greater thickness of device layer 302, and the high resistivity of bulk silicon layer 306 allows for the enhancement and advantages in the design of transistors or other semiconductor devices. Notably, in this configuration transistors 312 and 322 can be "stacked" together, i.e. closely spaced, while remaining electrically isolated to make advantageous circuits.

It is noted that in the configuration of structure 300 in FIG. 3, transistors 312 and 322 each consists of two gates (which might be implemented as a gate with two "fingers," "branches," i.e. as a "partitioned gate"). For example, transistor 312 consists of two gates 316 and 317 (or a gate with two fingers or two branches 316 and 317) that are shorted to each other by a metal interconnect or other interconnect, not shown in any of the Figures. Similarly, transistor 322 consists of two gates 326 and 327 (or a gate with two fingers or two branches 326 and 327) that are shorted to each other by a metal interconnect or other interconnect, not shown in any of the Figures. In some embodiments of the present invention, each transistor may consist of many more gates shorted to each other to represent a single electrical gate.

Each transistor may also consist of one or more drains (or one or more sources), interconnected to result in a single drain (or a single source). For example, transistor 312 is shown as having sources 314 and 315, which are shorted by a low resistivity interconnect not shown. Drain 318 is common between the shorted gates 316, 317, and the shorted sources 314 and 315 of transistor 312. However, in some embodiments more than one drain can be used (i.e. a drain with branches and fingers that are shorted to represent a single electrical drain). Similarly, transistor 322 is shown as having sources 324 and 325, which are shorted by a low resistivity interconnect not shown. Drain 328 is common between the shorted gates 326, 327, and the shorted sources 324 and 325 of transistor 322. However, in some embodiments more than one drain can be used (i.e. a drain with branches and fingers that are shorted to represent a single electrical drain).

Because of the significantly greater thickness of device layer 302, semiconductor material, e.g. silicon, remains between the bottom surfaces of the sources and drains of transistors 312 and 322 and the top surface of buried oxide layer 304 (such remaining semiconductor corresponds to the semiconductor remaining in thickness 248 in structure 200) in islands 330 and 340. This remaining semiconductor would result in source/drain junction capacitance, similar to the junction capacitance of structure 200 as discussed above.

It should be noted that the effect of the resulting capacitive load from source/drain junction capacitances in structure 200 or structure 300 is advantageously reduced by taking advantage of the thick buried oxide layer 204 or 304 and the high resistivity of bulk silicon layer 206 or 306. For example, the greater thickness of buried oxide layer 304 can reduce the effect of junction capacitances in transistors 312 and 322, and the higher resistivity of bulk semiconductor layer 306 can further reduce such capacitances by facilitating the formation of thick depletion regions 350 and 352, thereby reducing the effect of source/drain junction capacitances loading transistors 312 and 322. Moreover, preserving the advantages of SOI structures, during operation of transistors 312 and 322, islands 330 and 340 can withstand large positive and negative voltage excursions because of the electrical isolation provided by adjacent trenches 308, 309, and 310, and buried oxide layer 304.

Depth 354 of depletion regions 350 and 352 (not drawn to scale), extending from the bottom surface of buried oxide layer 304, might be in one embodiment about 20 microns into bulk semiconductor layer 306, and is much greater than the depth of a corresponding depletion region in conventional bulk semiconductor layer 106 in FIG. 1, which may be, for example, as little as 2 microns or even a tenth of a micron, because conventional structure 100 has a much lower resistivity bulk semiconductor.

Some further advantages of using the invention's SOI structures, such as transistors 312 and 322, are for example, improved noise isolation and lower power consumption. Also, insertion loss can be reduced, and the "ON" resistance of transistors 312 and 322 is reduced, and in this way intended signals can pass through transistors 312 and 322 and/or can be amplified without being subjected to too much noise and without losing signal strength, thus maintaining a high signal to noise ratio. Moreover, because the entire islands 330 and 340 can experience voltage excursions, the reduced capacitance between islands 330 and 340 and bulk semiconductor layer 306 also reduces the time constant required to charge islands 330 and 340.

Figure 4:
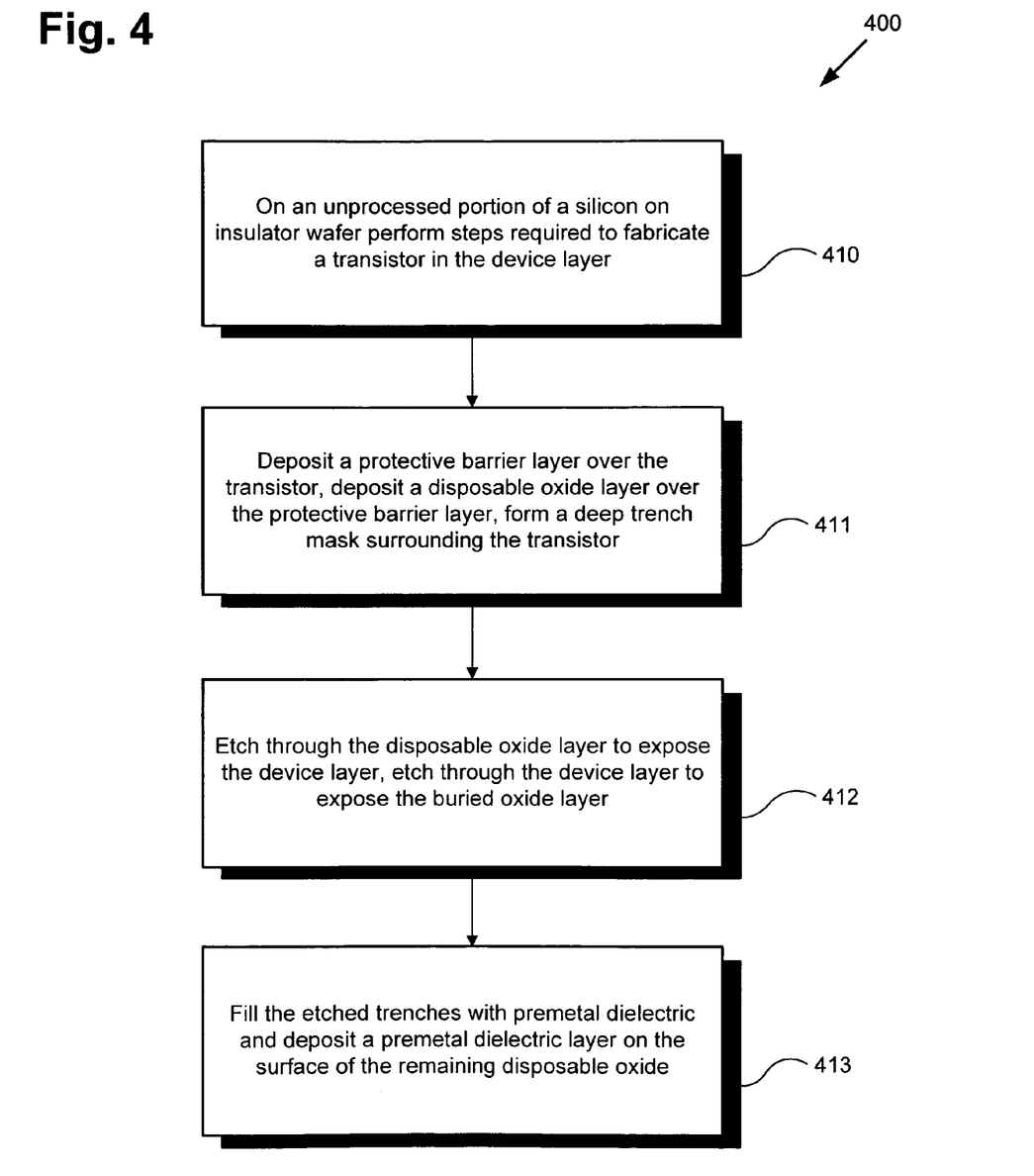
FIG. 4 shows a flowchart presenting an exemplary method for fabricating a SOI structure according to one embodiment of the present invention.

FIG. 4 shows flowchart 400 illustrating an exemplary method according to one embodiment of the present invention. Certain details and features have been left out of flowchart 400 that are apparent to a person of ordinary skill in the art. For example, a step may consist of one or more substeps or may involve specialized equipment or materials, as known in the art. Steps 410 through 413 indicated in flowchart 400 are sufficient to describe one embodiment of the present invention; however, other embodiments of the invention may utilize steps different from those shown in flowchart 400. It is noted that the processing steps shown in flowchart 400 are performed on a SOI wafer according to the invention which, prior to step 410, includes among other things, a device layer, a buried oxide layer, and a bulk semiconductor layer, which each conform substantially to corresponding layers in structure 200 or structure 300.

As one of the present invention's features, the invention improves upon the process of fabricating devices in a SOI wafer, such as the SOI wafer of structure 200, by filling trenches with, for example, silicon oxide as opposed to polysilicon, and by advantageously doing so at a different stage of the fabrication process, e.g. after transistor formation instead of prior to transistor formation. Doing so can simplify the fabrication process and make the fabrication process less expensive. In a conventional fabrication process that uses, for example, polysilicon trenches, the trenches must be etched, lined with oxide, and then filled with polysilicon. These conventional steps can take a long time to perform in a thick device layer, e.g. device layer 202, contemplated for the invention. The resulting polysilicon-filled trenches must be polished and capped off so that no electrical shorts are created. According to the present invention, in contrast with a conventional process that etches the trenches promptly after active area masking or active area formation, the trenches are etched later, for example before contact mask or contact formation, but after semiconductor devices, such as transistor 212, are fabricated.

Figure 5:
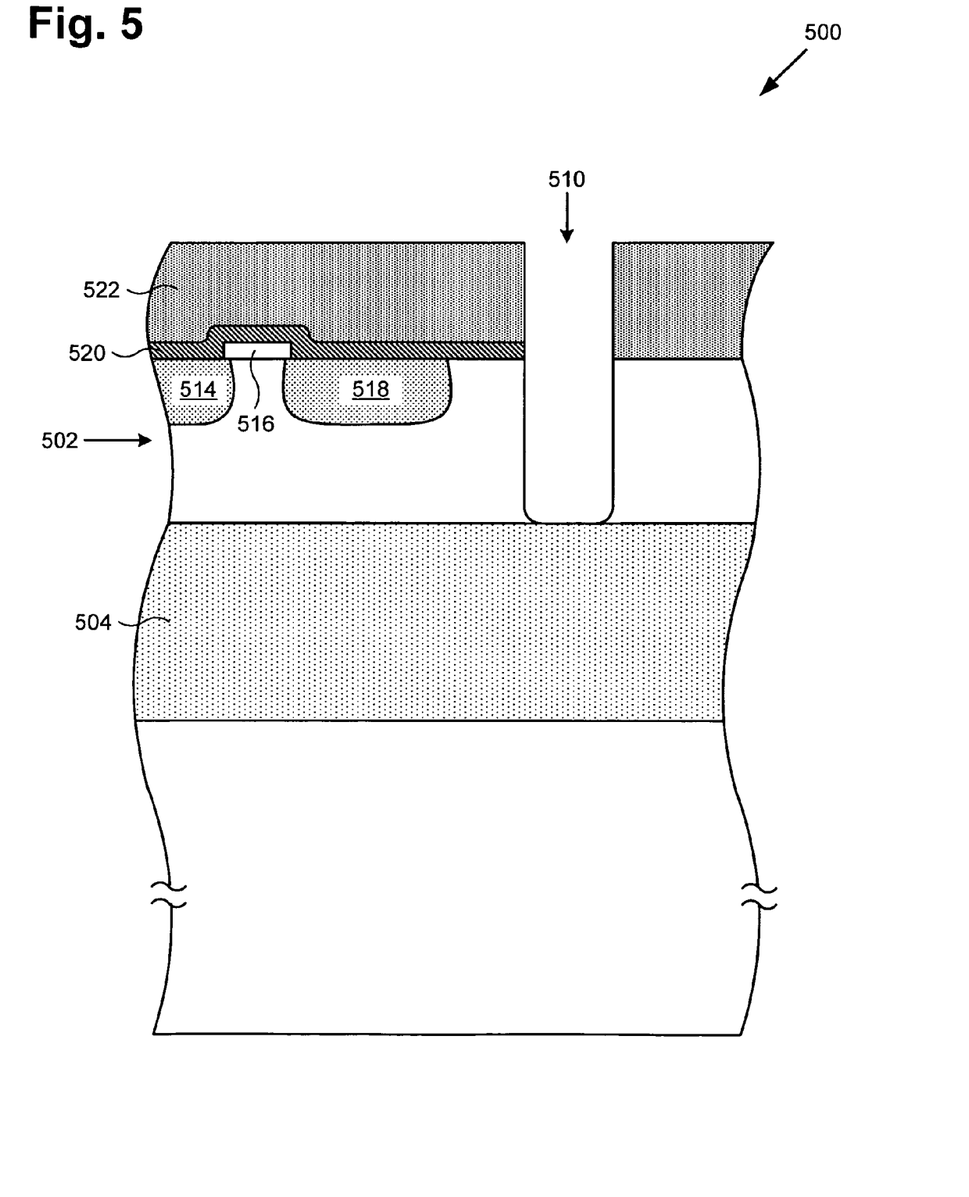
FIG. 5 shows an exemplary SOI structure according to one embodiment of the present invention.

In step 410 of flowchart 400, an initial step of processing is performed, including, for example, well creation, active formation, polysilicon processing, lightly doped drain processing, spacers for MOS transistors, source and drain implanting, salicide to prepare contact regions, and any other steps necessary to fabricate a transistor or other semiconductor device as known in the art. The semiconductor device, e.g. the transistor comprising source 514, gate 516, and drain 518 in FIG. 5, is formed in device layer 502 corresponding to device layer 202. Notably, in a departure from conventional processes, no trenches have been etched or formed as of step 410.

In flowchart 400 at step 411, a protective barrier layer is deposited over the semiconductor device, e.g. the transistor, created in step 410. The protective barrier layer is shown as layer 520 in FIG. 5, and may be, for instance, an oxide barrier layer or a nitride barrier layer, which when deposited protects the semiconductor device. After the protective barrier layer is deposited, a disposable oxide is deposited on top of the protective barrier layer. The disposable oxide is shown as layer 522 in FIG. 5. To conclude step 411, a deep trench mask is formed around the semiconductor device, e.g. around the transistor, in the disposable oxide.

In flowchart 400 at step 412, the disposable oxide in the deep trench mask area is etched, and then the deep trench masking resist is stripped, as known in the art. At that point in step 412, trenches have been formed in the device layer by etching away the disposable oxide, but the disposable oxide deposited in step 411 remains on the remainder of the SOI wafer. Subsequently, the device layer is etched down to the buried oxide layer. In one embodiment of the invention this etching substep is imperfect, and some disposable oxide is etched as well, while some disposable oxide remains unetched. The result of this step is illustrated in FIG. 5, where trench 510 has been etched through disposable oxide 522 and device layer 502 to the top surface of buried oxide layer 504. Adjacent to trench 510, barrier layer 520 protects source 514, gate 516, and drain 518 of the semiconductor device (shown as a transistor in FIG. 5).

Figure 6:
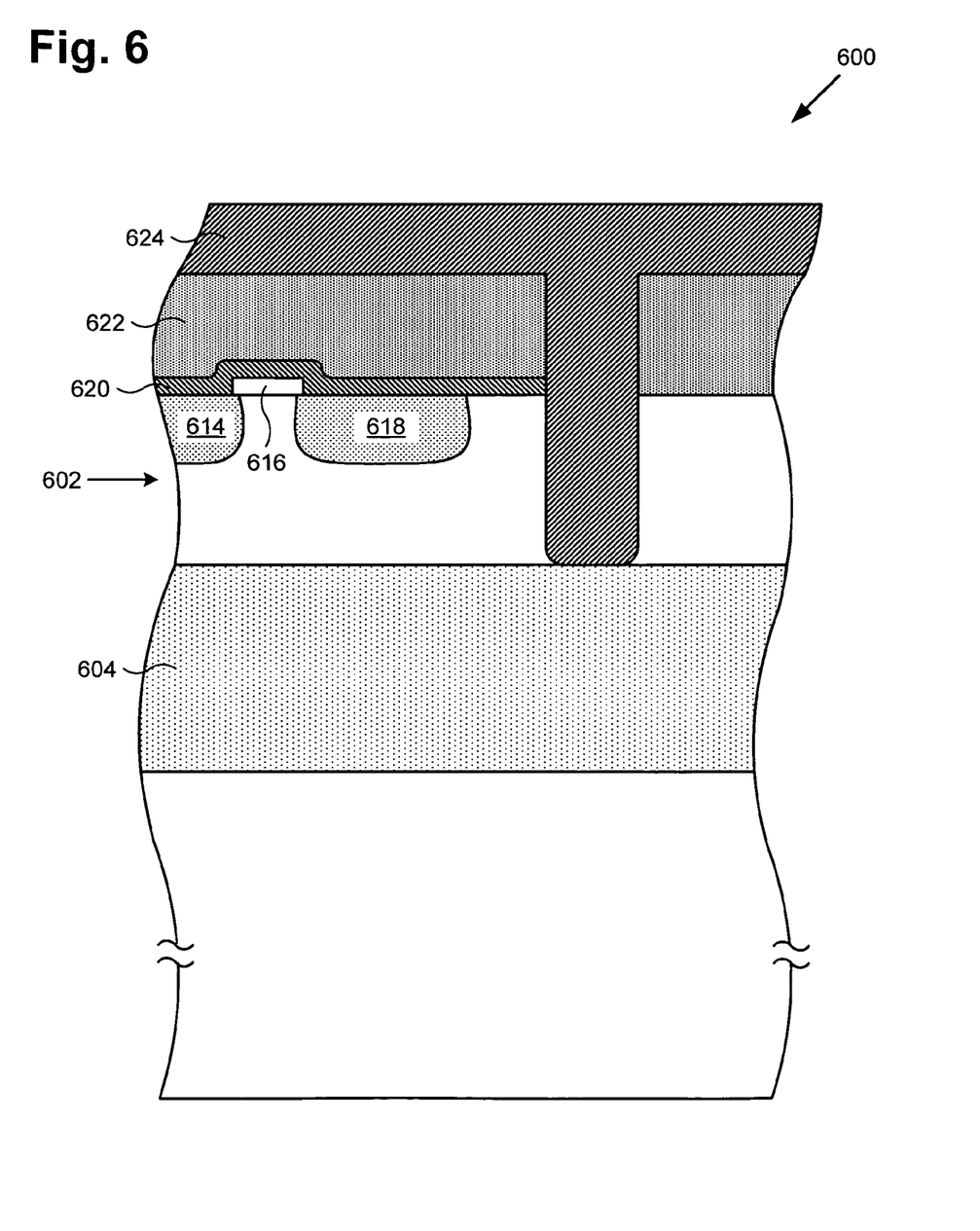
FIG. 6 shows an exemplary SOI structure according to one embodiment of the present invention.

In flowchart 400 at step 413, a dielectric, shown as layer 624 in FIG. 6, is deposited over the remaining disposable oxide, i.e. over layer 622 (layer 622 corresponds to layer 522 in FIG. 5). The dielectric covers the remaining disposable oxide and fills in the trenches etched in step 412 adjacent to barrier layer 620 and extending through device layer 602 to the top surface of buried oxide layer 604. The dielectric in the trench thus electrically isolates the semiconductor device, i.e. the transistor comprising source 614, gate 616, and drain 618, from separate regions in device layer 602, as shown in FIG. 6. Afterwards, step 413 may be concluded by performing a chemical mechanical polish on a top surface of layer 624, followed by steps such as another dielectric, contact formation, metal deposition, and top metals, as known in the art.

The invention's unique combination of, for example, dielectric trenches formed during a "backend" process, compatibility with bulk silicon wafer design methodologies, device models, and design kits (e.g. CMOS design kits or transistor design kits intended for semiconductor structure fabrication in a conventional bulk silicon wafer), use of a high resistivity bulk semiconductor layer, and thick device and buried oxide layers, as discussed above, permits the fabrication of circuits with several advantages. The invention additionally avoids problems associated with utilizing conventional bulk silicon or conventional SOI wafers, as discussed above. For example, high voltage and high speed transistors can be fabricated, with the added benefits of reduced cost compared to other processes such as, for example, gallium arsenide processes, while allowing integration with CMOS processes, for example, on a single wafer. In fact, in addition to enabling use of bulk semiconductor device models and design methodologies, another advantage of the thick device layer in the invention's SOI structures is that the invention's wafer fabrication processes can be run and implemented in a bulk semiconductor factory, i.e. at the same time as bulk semiconductor wafers are processed and even in the same wafer lots. In contrast, using conventional SOI structure 100 in FIG. 1 to fabricate circuits would require more complex fabrication processes since the conventional SOI wafers typically cannot be fabricated using bulk semiconductor wafer processes or in the same wafer lots.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor on insulator (SOI) structure comprising:
   a buried oxide layer over a bulk semiconductor layer;
   a device layer on said buried oxide layer, wherein said device layer comprises a substantially un-doped semiconductor at an interface between said device layer and said buried oxide layer;
   at least one transistor fabricated in said device layer, wherein a source/drain junction of said at least one transistor does not contact said buried oxide layer, thereby forming a source/drain junction capacitance, and wherein a thickness of said device layer is configured such that said source/drain junction capacitance behaves substantially similarly to a source/drain junction capacitance of a semiconductor structure fabricated on a bulk silicon wafer;
   at least one trench extending through said device layer and contacting a top surface of said buried oxide layer, thereby electrically isolating said at least one transistor;
   wherein a high resistivity of said bulk semiconductor layer facilitates formation of at least one thick depletion region that extends from a bottom surface of said buried oxide layer into said bulk semiconductor layer, such that a thickness of said at least one thick depletion region is based on said high resistivity.

2. The SOI structure of claim 1, wherein said at least one trench is formed after fabrication of said at least one transistor.

3. The SOI structure of claim 1, wherein said at least one transistor is situated within an isolated island in said device layer.

4. The SOI structure of claim 1, wherein said at least one transistor is an NFET.

5. The SOI structure of claim 1, wherein said at least one transistor is a PFET.

6. The SOI structure of claim 1, wherein said device layer comprises silicon.

7. The SOI structure of claim 1, wherein said buried oxide layer comprises silicon oxide.

8. The SOI structure of claim 1, wherein said bulk semiconductor layer comprises silicon.

9. The SOI structure of claim 1 further including a well formed in said device layer.

10. The SOI structure of claim 1, wherein said high resistivity of said bulk semiconductor layer is approximately 1000 ohms-centimeter or greater.

11. A method for fabricating a semiconductor on insulator (SOI) structure, said method comprising:

forming a source/drain junction in a device layer situated on said buried oxide layer and over a bulk semiconductor layer such that said source/drain junction does not contact said buried oxide layer, thereby causing said source/drain junction to have a junction capacitance, wherein said device layer comprises a substantially un-doped semiconductor at an interface between said device layer and said buried oxide layer, and wherein a thickness of said device layer is configured such that said source/drain junction capacitance behaves substantially similarly to a source/drain junction capacitance of a semiconductor structure fabricated on a bulk silicon wafer;

utilizing said source/drain junction in formation of at least one transistor in said device layer;

wherein a high resistivity of said bulk semiconductor layer facilitates formation of at least one thick depletion region that extends from a bottom surface of said buried oxide layer into said bulk semiconductor layer, such that a thickness of said at least one thick depletion region is based on said high resistivity.

12. The method of claim 11 further comprising forming at least one trench in said device layer adjacent to said at least one transistor.

13. The method of claim 12 further comprising depositing a dielectric in said at least one trench, thereby electrically isolating said at least one transistor.

14. The method of claim 13, wherein said depositing comprises completely filling said at least one trench with said dielectric.

* * * * *